United States Patent [19]  [11]  4,336,467
Lisco  [45]  Jun. 22, 1982

[54] VOLTAGE DETECTOR

[75] Inventor: Richard J. Lisco, Whippany, N.J.

[73] Assignee: Bell Telephone Laboratories, Incorporated, Murray Hill, N.J.

[21] Appl. No.: 117,051

[22] Filed: Jan. 31, 1980

[51] Int. Cl.³ ............................................. H03K 5/153
[52] U.S. Cl. .................................... 307/350; 307/354; 307/363; 179/175.2 C
[58] Field of Search ............... 307/350, 354, 362, 363; 328/149, 150; 330/138, 280, 285, 290; 179/155, 175.2 C, 175.2 B

[56] References Cited

U.S. PATENT DOCUMENTS 3,378,781  4/1968  Hill ....................................... 330/290
3,505,537  4/1970  Giordano ............................. 307/362
3,678,295  7/1972  Heneghan ............................ 307/350

Primary Examiner—John Zazworsky
Attorney, Agent, or Firm—R. O. Nimtz

[57] ABSTRACT

A direct current voltage detector is disclosed including a low-pass filter, an isolating diode and a threshold detector. The circuit is designed to be simple and inexpensive and causes no interference with foreign potential and leakage tests on a telephone line.

2 Claims, 2 Drawing Figures

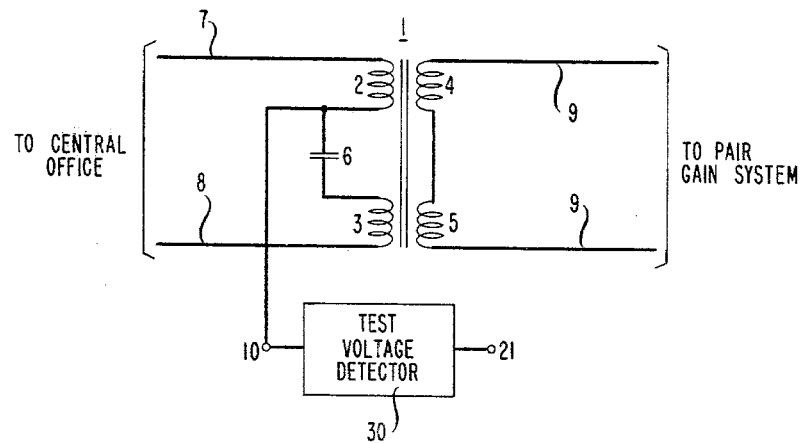
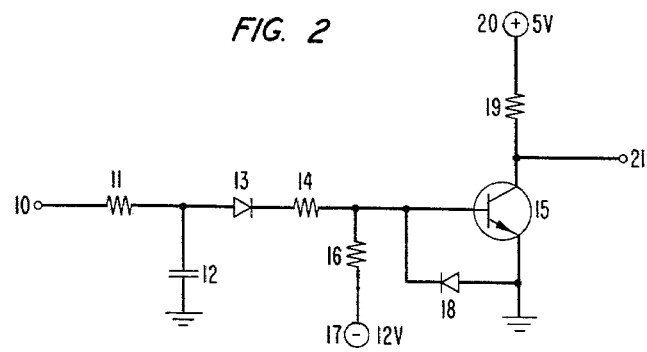

VOLTAGE DETECTOR

BACKGROUND OF THE INVENTION

1. Field of the Invention

This invention relates to detecting circuits and, more particularly, to the detection of a direct current voltage in the presence of interfering alternating current and direct current voltages.

2. Description of the Prior Art

It is well-known to provide the detection of direct current voltages by means of voltage threshold devices which respond to voltages exceeding that threshold. Particular problems arise, however, in environments in which spurious voltages are also present and which must be discriminated against when detecting the desired voltage. Thus, direct current voltages of different polarity or of different magnitudes must be discriminated against as well alternating current voltages which may have components exceeding the test voltage. One such system is shown in U.S. Pat. No. 4,270,030 issued May 26, 1981 to S. J. Brolin et al.

In a telephone system environment, it is often necessary to detect a particular line voltage level while, at the same time, not to interfere with standard test responses such as leakage tests and foreign potential tests. The detector circuit must therefore not only respond correctly to the desired voltage, but also present a high enough impedance to permit standard leakage tests. In addition, the detector circuit must not feed voltages back into the telephone circuit which would cause false responses during a foreign potential test.

SUMMARY OF THE INVENTION

In accordance with the illustrative embodiment of the present invention, a voltage detector is provided which includes an alternating current filter section, a diode and a threshold voltage detector. The filter removes alternating current components while the diode isolates the circuit being tested from voltages generated in the detection circuit. The threshold detector insures that the direct current voltage being measured has a magnitude exceeding a specified preselected threshold.

One feature of the present invention is the ability of this detector circuit to present a very high impedance (the reverse bias impedance of a low leakage diode) to a negative potential placed on a telephone line circuit, thus providing compatability with leakage testing.

In accordance with another feature of the invention, the detector circuit is immune to alternating circuit voltages, such as induced 60 Hz voltages, and is not responsive to voltages of a proper polarity but of a lower magnitude than the test voltage.

Finally, the detector circuit of the present invention does not place any voltages on the line being tested which might be interpreted as foreign potentials.

BRIEF DESCRIPTION OF THE DRAWINGS

In the drawings:

FIG. 1 is a detailed circuit diagram of a telephone line circuit including the test voltage detector in accordance with the present invention; and FIG. 2 is a detailed circuit diagram of the test voltage detector shown in block form in FIG. 1.

DETAILED DESCRIPTION

In FIG. 1 there is shown a detailed circuit diagram of a telephone line circuit comprising a hybrid coil 1 having two primary windings 2 and 3 and two secondary windings 4 and 5. A capacitor 6 is connected in series between primary windings 2 and 3. Windings 2 and 3 are connected to tip conductor 7 and ring conductor 8, respectively, which are connected to the central office appearance of a telephone line. Secondary windings 4 and 5 are connected in series to a pair of conductors 9 which, in turn, are connected, for example, to a pair gain system. As previously noted, such a pair gain system is shown in the S. J. Brolin et al patent.

Connected to primary winding 2 is a test voltage detector 30 having an input terminal 10 and an output terminal 21. Detector 30 detects the presence of a test voltage on tip conductor 7 having a magnitude which exceeds a threshold, e.g., 90 volts, and which is poled so as to be positive on tip conductor 7. Detector 30 is unresponsive to positive voltages of lower magnitude, is unresponsive to negative voltages on tip conductor 7 and is unresponsive to alternating current signals on tip conductor 7. The output of detector 30 at terminal 21 is utilized in the pair gain system to initiate test activities on the particular telephone circuit connected to conductors 7 and 8. As noted in the aforementioned S. J. Brolin et al patent, these tests may comprise local drop tests at the remote end of the pair gain system as well as tests of the pair gain system itself.

In FIG. 2 there is shown a detailed circuit diagram of the test voltage detector 30 shown in block form in FIG. 1. The voltage detector of FIG. 2 comprises an input terminal 10 to which is connected a resistor 11, the other end of which has a capacitor 12 connected to ground potential. The midpoint of resistor 11 and capacitor 12 is connected to the anode of a diode 13, the cathode of which is connected through a resistor 14 to the base electrode of transistor 15. The base electrode of transistor 15 is biased through a biasing resistor 16 to negative voltage source 17.

The emitter of transistor 15 is connected to ground potential. A diode 18, poled oppositely to the base-emitter junction of transistor 15, is connected between the base and emitter of transistor 15. The collector of transistor 15 is biased through biasing resistor 19 to positive voltage source 20. The collector of transistor 15 is connected to output terminal 21.

The circuit of FIG. 2 operates as follows: In the absence of an enabling voltage at input terminal 10, a current is drawn through diode 18 and resistor 16 to negative voltage supply 17. The voltage drop across diode 18 (approximately 0.6 volts) provides a reverse bias on the base of transistor 15 which keeps transistor 15 cut off. Under this condition, the voltage at output terminal 21 is the value of bias supply voltage 20. In order to perform a telephone line foreign potential test, it is important that the present detector circuit not cause voltages to appear on the connected telephone circuit. Diode 13 is forward biased during foreign potential tests, however, and provides a compensating voltage drop opposite to the voltage drop across diode 18; therefore, the net voltage fed back to input terminal 10 is essentially zero. Thus, the circuit of FIG. 2 does not interfere with foreign potential tests.

Alternating current components at input terminal 10 are filtered out by the combination of resistor 11 and capacitor 12 and thus are insufficient to trigger the detector circuit.

A positive voltage at input terminal 10 forward biases diode 13, causing a current to flow through resistors 11 and 14. The bias current flowing through diode 18 and resistor 16 must, however, be overcome by the current flowing through diode 13 before transistor 15 is triggered ON. The values of the circuit components are chosen such that this bias current is overcome only when the voltage at input terminal 10 exceeds the desired value. Thus, the threshold value is essentially determined by the values of resistors 11, 14 and 16 and power supply 17. When this threshold current is exceeded, transistor 15 is turned on and rapidly saturates to pull the voltage at output terminal 21 from the positive voltage of supply 20 to near ground potential. This shift in voltage levels at output terminal 21 represents the output of the detector and thus signals the presence of a positive voltage of the proper magnitude at input terminal 10.

It will be noted that the diode 13 in FIG. 2 is placed after, rather than before, the filter section comprising resistor 11 and capacitor 12. In this way, no nonlinear filtering or rectification of the alternating current components takes place in the circuit. In addition, the values of resistors 11 and 14 can be chosen so as to be sufficiently high that the detector of FIG. 2 presents a high impedance to the telephone loop connected to input terminal 10. As previously mentioned, the telephone loop is isolated from voltages generated in the circuit of FIG. 2 by the compensating voltage drops across diodes 13 and 18.

Appropriate values for the components of FIG. 2, when used to detect a test voltage equal to or exceeding 90 volts, are given in Table I.

TABLE I

R11 = 82.5K ohms
R14 = 82.5K ohms
R16 = 23.3K ohms
R19 = 100.0K ohms
C12 = 2.15 microfarads Such a circuit can therefore be used to respond uniquely to a positive test voltage of 90 volts or more and yet be unresponsive to alternating current voltages, negative voltages, or positive voltages less than 90 volts.

I claim:

1. A telephone line voltage detector for use in telephone pair gain systems and for detecting the presence of positive test voltages greater than a predetermined threshold on either conductor of said telephone line and, in response to the detection of said test voltage, generating an output signal from said detector, said output signal being used to initiate testing of said pair gain system and of said telephone line, said detector comprising in sequence
   a low-pass filter,
   a first diode,
   a first resistor, and
   a threshold detector, the two ends of said first resistor connected between said first diode and said threshold detector, thereby enabling said low-pass filter to operate substantially linearly,
   said threshold detector comprising
   a transistor, and
   means comprising a second diode and a second resistor for biasing said transistor to the cut-off state, said second diode providing a compensating voltage drop opposite to the voltage drop across said first diode in response to said input voltage applied to said detector.

2. A detector circuit for producing a continuous output signal in response to and for as long as a positive voltage test signal to said circuit exceeds a predetermined threshold level, said circuit comprising
   an input terminal,
   an output terminal,
   a first resistor, a first diode, a second resistor and the base-collector path of a transistor connected in series between said input and output terminals,
   a capacitor connecting the midpoint of said first resistor and said first diode to ground potential,
   means for biasing the base and the collector of said transistor,
   a second diode connected in parallel with and poled oppositely to the base-emitter path of said transistor, the voltage drop across said second diode compensating for the voltage drop across said first diode, and
   said second resistor being used to prevent a low-pass filter comprising said first resistor and said capacitor from operating nonlinearly.

* * * * *